(12) United States Patent
Lan

(10) Patent No.: US 7,724,522 B2
(45) Date of Patent: May 25, 2010

(54) HEAT SINK DEVICE FOR A DISPLAY CARD

(75) Inventor: Tzu-Lun Lan, Chung-Ho (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 0 days.

(21) Appl. No.: 12/314,939

(22) Filed: Dec. 19, 2008

(65) Prior Publication Data

US 2009/0168352 A1  Jul. 2, 2009

(30) Foreign Application Priority Data

Jan. 2, 2008  (TW) ............................... 97200033 U

(51) Int. Cl.
 *H05K 7/20* (2006.01)
(52) U.S. Cl. ................ 361/695; 361/703; 361/704; 361/710; 361/719; 165/80.3; 165/122; 257/719; 257/722; 257/727
(58) Field of Classification Search .................. None
See application file for complete search history.

(56) References Cited

U.S. PATENT DOCUMENTS

| 5,927,386 | A  | * | 7/1999  | Lin ......................... 165/80.3 |
| 7,221,567 | B2 | * | 5/2007  | Otsuki et al. ................. 361/695 |
| 7,289,324 | B2 | * | 10/2007 | Yu ............................. 361/697 |
| 7,349,210 | B2 | * | 3/2008  | Sheng et al. ................. 361/695 |
| 7,411,327 | B2 | * | 8/2008  | Watanabe et al. .............. 310/71 |
| 2006/0066161 | A1 | * | 3/2006 | Matsumoto ................ 310/67 R |
| 2006/0097704 | A1 | * | 5/2006 | Deverall et al. ............. 323/201 |
| 2007/0181288 | A1 | * | 8/2007 | Chen et al. .................. 165/80.3 |

\* cited by examiner

*Primary Examiner*—Boris L Chervinsky
(74) *Attorney, Agent, or Firm*—Rosenberg, Klein & Lee

(57) ABSTRACT

A heat sink device for a display card includes a heat sink, the heat sink having a base and a plurality of heat-dissipating fins on the base, the base having two hooks respectively beside two lateral sides of the groove; a heat-dissipating fan, having a blade wheel and a power wire for the blade wheel, the blade wheel being on the base and the power wire being inside the groove of the base; and a fastener, having two engagement parts respectively corresponding to the hooks, wherein the fastener covers the groove so as to position the power wire by means of engagement of the hooks with the engagement parts. Therefore, the power wire of the heat-dissipating fan can be properly arranged on the heat sink.

6 Claims, 6 Drawing Sheets

HEAT SINK DEVICE FOR A DISPLAY CARD

BACKGROUND OF THE INVENTION

1. Field of the Invention

The invention generally relates to a heat sink for a display card, especially to a heat sink device for a display card in which a power wire of a heat-dissipating fan can be properly positioned on the heat sink of the heat sink device.

2. Description of Related Art

With the development of 3D game or Hi-Fi dynamic image technology, a computer system may be required to upgrade so as to catch up with the current image-processing speed and comply with the need of huge data capacity. For the computer system, a display card is generally the main device responsible for image processing. The display card is usually equipped with a heat-dissipating device to assist with heat dissipation for the display card.

A conventional heat-dissipating device for a display card includes a heat sink and a heat-dissipating fan on the heat sink. With the use of the heat sink thermal conduction and the air convection created by the heat-dissipating fan, the heat generated by the display card can be dissipated so that the display card can be ensured to continue under normal operation status. Therein, the heat-dissipating fan usually has a power wire to connect to a power supply for offering enough power.

However, the power wire of the conventional heat-dissipating device is usually freely exposed to the heat sink, resulting in that the power wire being easily exposed and interferes with the operation of the heat-dissipating fan, or even come into contact with the blades of the heat-dissipating fan. The heat-dissipating fan might thereby be stopped and therefore the display card can be damaged due to over heating.

Some approached have been made to overcome the above disadvantages by tapes or screws to adhere or screw the power wire onto the heat sink. If the tape is used, it is easy to loose its adhesiveness or it may be peeled from the heat sink. Under this situation, the power wire is exposed again. If the screw is used, then the assembly cost will increase which is undesirable.

SUMMARY OF THE INVENTION

It is an object of the present invention to provide a heat sink device for a display card in which a power wire of a heat-dissipating fan is properly positioned on the heat sink of the heat sink device.

In order to achieve the above and other objectives, the heat sink device for the display card according to the present invention includes a heat sink, the heat sink having a base and a plurality of heat-dissipating fins on the base, the base having two hooks respectively beside two lateral sides of the groove; a heat-dissipating fan, having a blade wheel and a power wire for the blade wheel, the blade wheel being on the base and the power wire being inside the groove of the base; and a fastener, having two engagement parts respectively corresponding to the hooks, wherein the fastener covers the groove to position the power wire by means of engagement of the hooks with the engagement parts.

The heat sink device for the display card according to the present invention properly positions the power wire on the heat sink and helps tidy up the power wire, so that the power wire can effectively avoid disturbing the operation of the heat-dissipating fan and avoid stopping the rotation of the blade wheel due to the power wire coming into contact with the blade wheel of the heat-dissipating fan.

To provide a further understanding of the present invention, the following detailed description illustrates embodiments and examples of the present invention, this detailed description being provided only for illustration of the present invention.

DETAILED DESCRIPTION OF PREFERRED EMBODIMENTS

Figure 1:
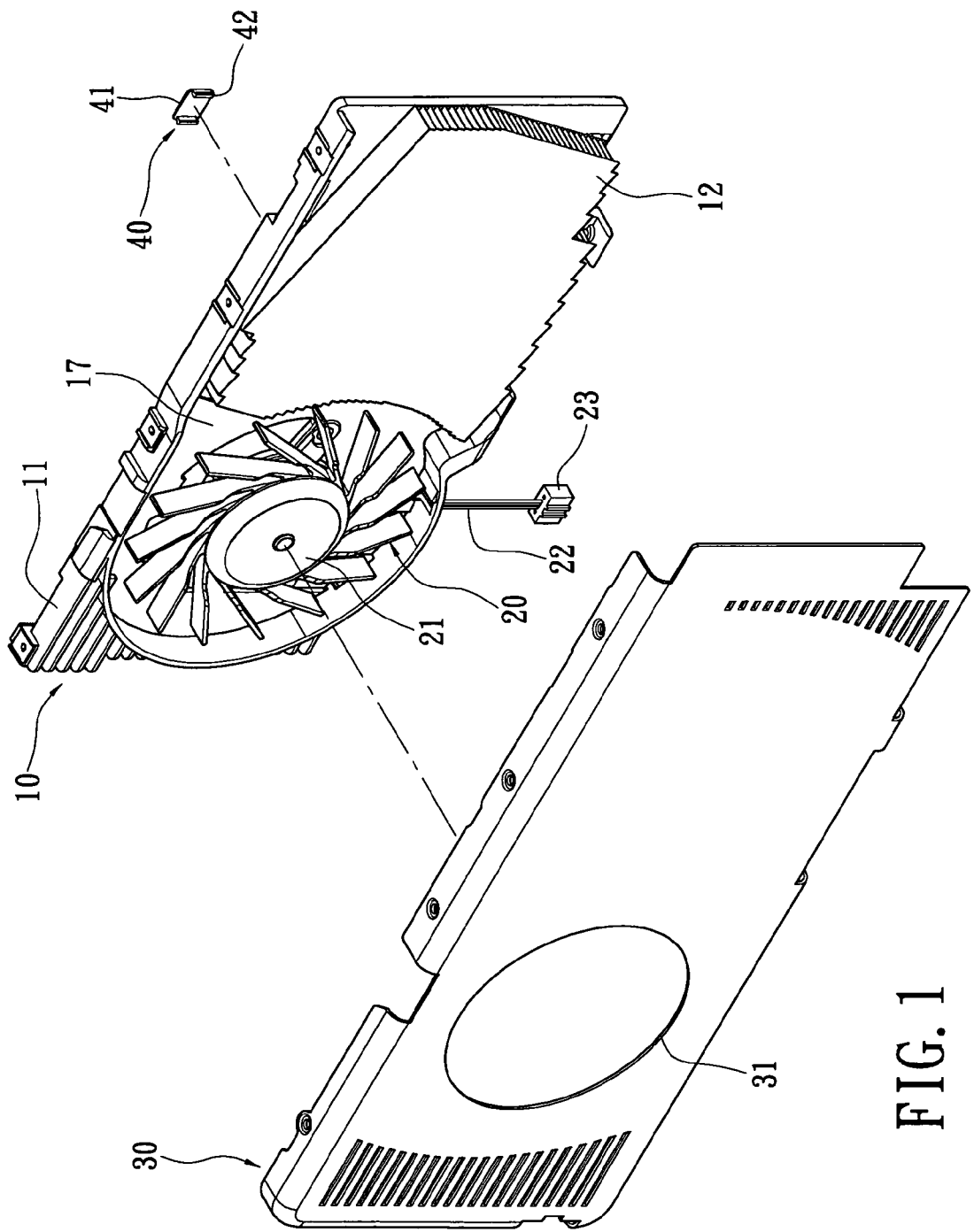
FIG. 1 is an exploded view of a heat sink device for a display card according to the present invention.

Wherever possible in the following description, like reference numerals will refer to like elements and parts unless otherwise illustrated.

Figure 2:
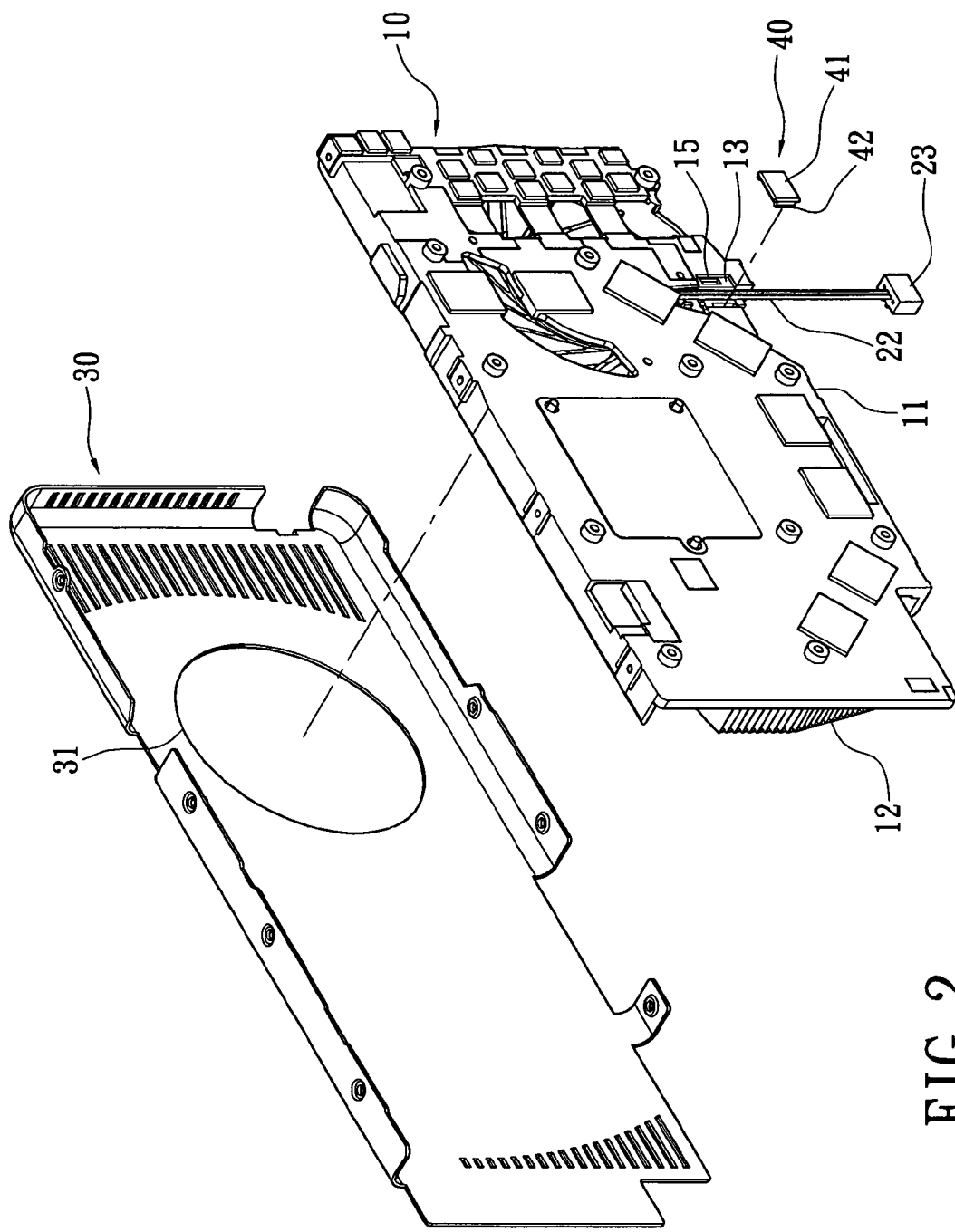
FIG. 2 is an exploded view, taken at a different angle of view from FIG. 1, of a heat sink device for a display card according to the present invention.
Figure 3:
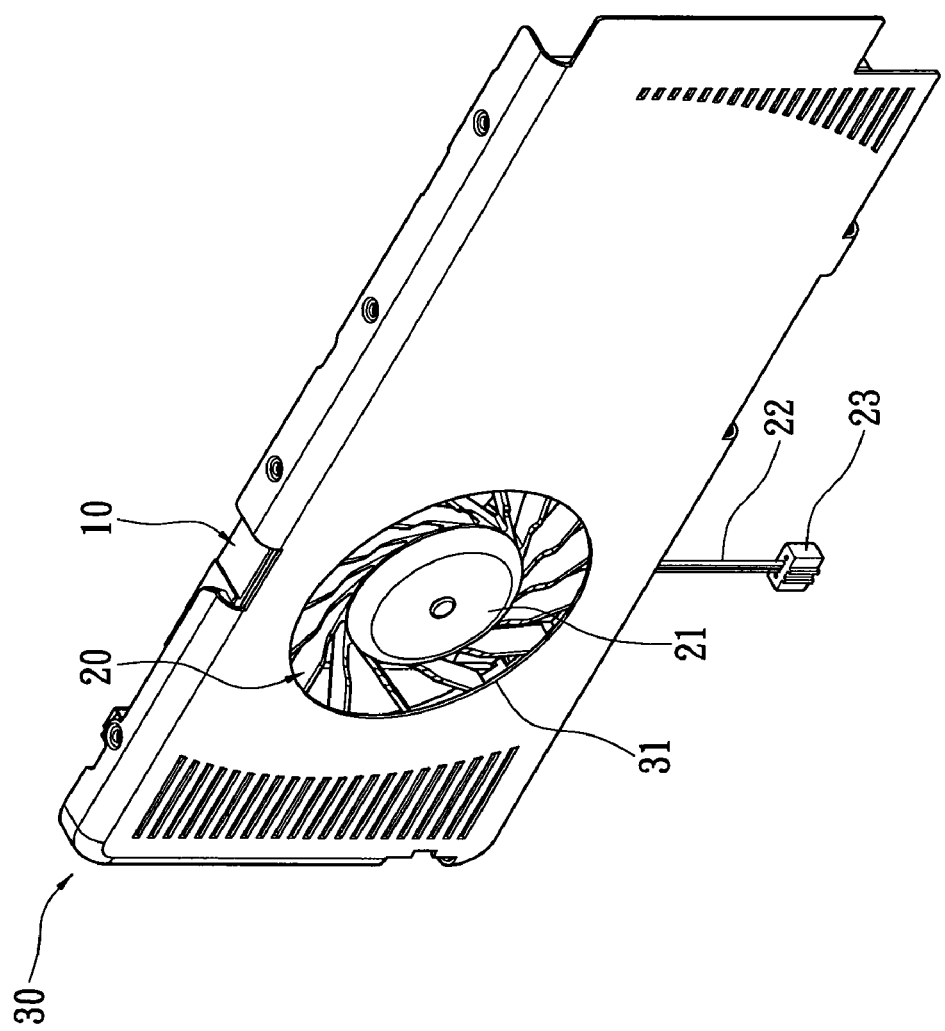
FIG. 3 is a perspective view of a heat sink device for a display card according to the present invention.

Referring to FIG. 1 and FIG. 2, a heat sink device for a display card according to an embodiment of the present invention includes a heat sink 10, a heat-dissipating fan 20, a mask 30, and a fastener 40.

Figure 6:
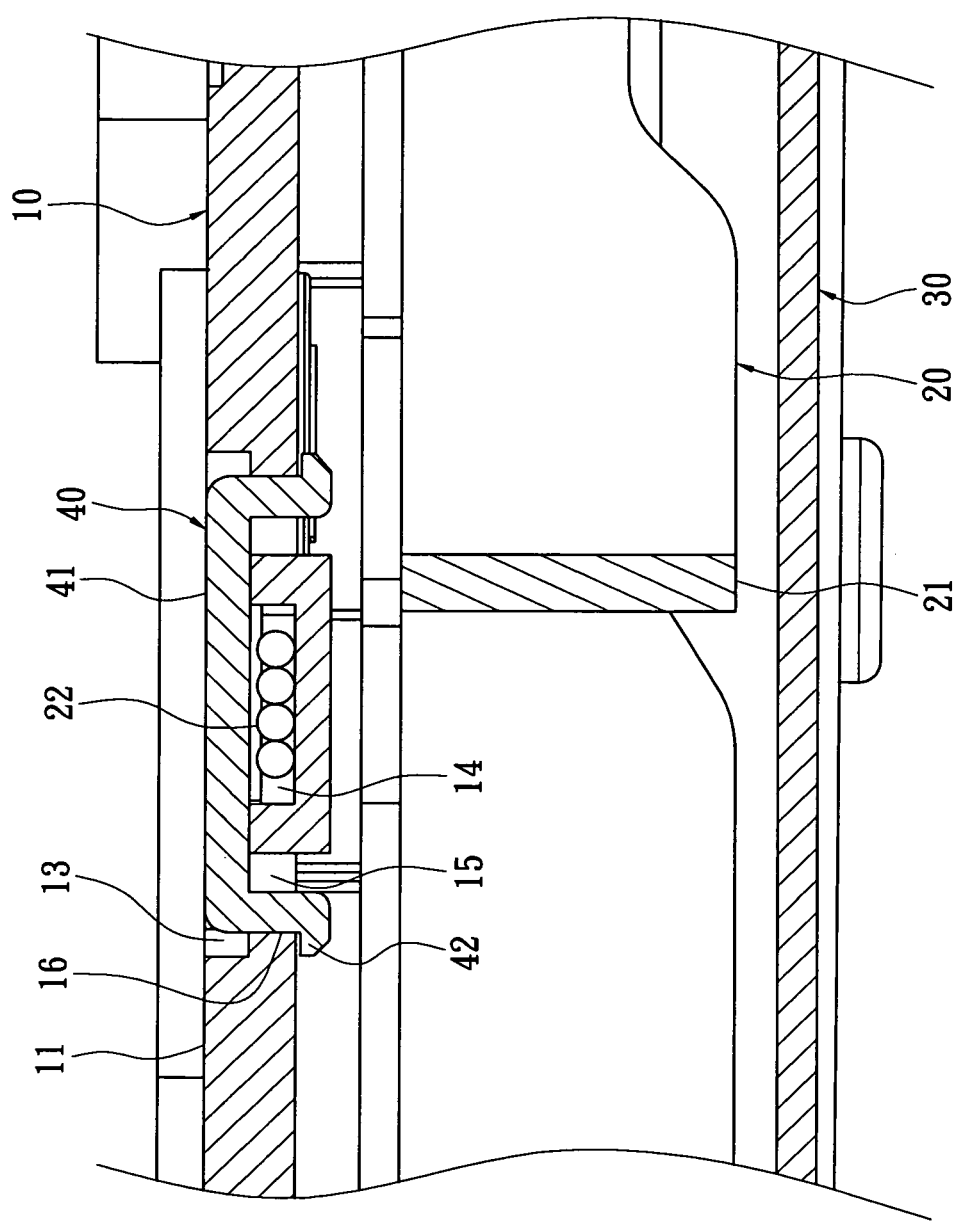
FIG. 6 is a cross-sectional view taken along the cross-section line 6-6 of FIG. 5.

The heat sink 10 includes a base 11 and a plurality of heat-dissipating fins 12. The base 11 is made of thermal conductive material and has an accommodating trough 13 corresponding to the fastener 40. The base 11 has a concave groove 14 on a wall of the accommodating trough 13 toward the interior of the base 11, as shown in FIG. 6. The base 11 has two through holes 15 and two hooks 16 beside two lateral sides of the groove 14, as shown in FIG. 6. Each of the hooks 16 is next to the corresponding through hole 15, while the hooks 16 are arranged opposite to each other.

The heat-dissipating fins 12 are arranged at intervals over the base 11. The base 11 has a fan receiver 17 on the side thereof where the heat-dissipating fins 12 are located, as shown in FIG. 1, for the heat-dissipating fan 20 to be accommodated.

The heat-dissipating fan 20 includes a blade wheel 21, a power wire 22, and a power connector 23. The blade wheel 21 creates an air flow to force the heat to be dissipated out when rotating. One end of the power wire 22 connects to the blade wheel 21 to supply the power needed for driving the blade wheel 21 to rotate. The power connector 23 is located at the other end of the power wire 22 for connecting to a corresponding connector inside a computer system. The heat-dissipating fan 20 in the present embodiment is a centrifugal fan, but is not limited thereby.

The mask 30 is a hollow mask, one side of which has an aperture 31 corresponding to the blade wheel 21 so that the heat-dissipating fan 20 is allowed to pass through the aperture 31.

The fastener 40 includes a plate 41 and two engagement parts 42. The engagement part 42 is formed by extending opposite sides of the plate 41 toward the heat sink 10 of the base 11. The two engagement parts 42 are flexible and corresponds to the two hooks 16.

Referring to FIG. 3 through FIG. 6, after the heat sink device for the display card according to the present invention has been assembled, the blade wheel 21 of the heat-dissipating fan 20 is located inside the fan receiver 17 of the base 11 of the heat sink 10, as shown in FIG. 1, so that the blade wheel 21 is on one side of the heat-dissipating fins 12.

The mask 30 covers the base 11 so that the heat-dissipating fan 20 and the heat-dissipating fins 12 are between the mask 30 and the base 11.

Figure 4:
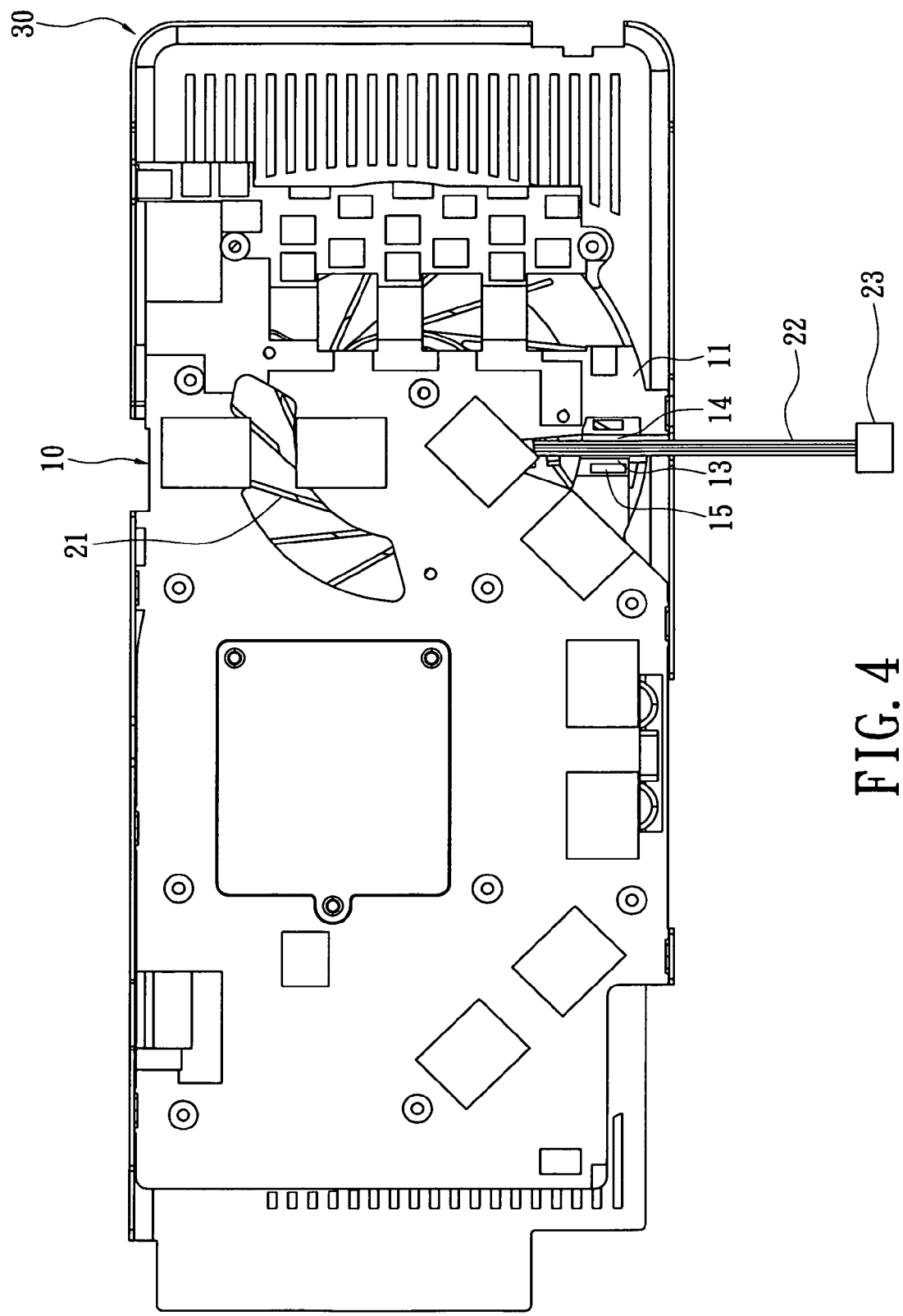
FIG. 4 is a rear view of a heat sink device for a display card according to the present invention, in which no fastener is shown.
Figure 5:
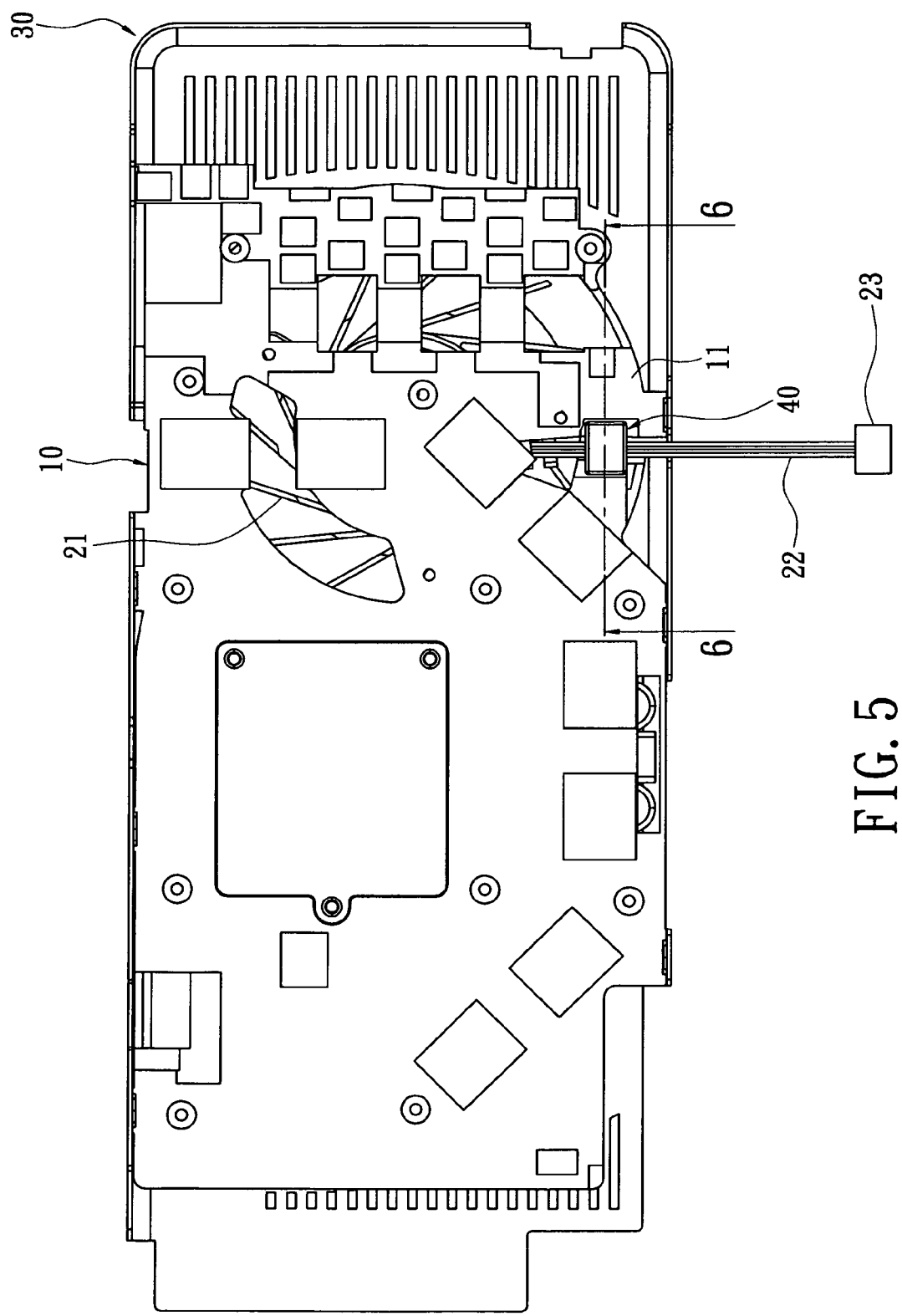
FIG. 5 is a rear view of a heat sink device for a display card according to the present invention, in which a fastener is shown.

The power wire 22 of the heat-dissipating fan 20 is inside the groove 14 of the base 11, as shown in FIG. 4. One end of the power wire 22 connecting to the power connector 23 stretches out of base 11.

When the fastener 40 is to be assembled to the base 11 of the heat sink 10, the engagement parts 42 of fastener 40 respectively penetrate through the corresponding through holes 15, as shown in FIG. 6. Meanwhile, the plate 41 is pressed down to force the engagement parts 42 to engage with the corresponding hooks 16 so that the plate 41 of the fastener 40 is accommodated within the accommodating trough 13 of the base 11, with the fastener 40 covering the top of the groove 14 and the power wire 22 being secured inside the groove 14 of the base 11.

When the fastener 40 is to be disassembled from the base 11 of the heat sink 10, the flexibility of the engagement parts 42 of the fastener 40 allows the plate 41 to move away from the base 11 by means of resilient deformation of the engagement parts 42. Therefore, the engagement parts 42 are released from the bottom of the hooks 16 of the base 11, and then the engagement parts 42 pass the through holes 15. The fastener 40 can be then easily taken out.

While the heat sink device for the display card is utilized according to the present invention, the heat-dissipating fan 20 sucks the air from the aperture 31 of the mask 30. The sucked air is drawn out through the heat-dissipating fins 12 of the heat sink 10 so that the air takes away all heat as it passes the heat-dissipating fins 12. Meanwhile, the air is also exhausted through the side of the heat-dissipating fins 12 opposite to the heat-dissipating fan 20.

In light of the aforementioned details, the heat sink device for the display card according to the present invention has a fastener compatible with the base of the heat sink. The base of the heat sink has the groove for positioning the power wire. Besides, the base has two hooks each of which is arranged on either side of the groove in a manner that corresponds to the two engagement parts of the fastener. By means of the engagement of the hooks with the engagement parts, the fastener covers the groove and therefore positions the power wire. The fastener used in the present invention can be easily and quickly assembled and disassembled, and offers superior positioning effect.

In addition, the heat sink device for the display card according to the present invention also helps to tidy up the power wire, so that the power wire can be properly allocated over the heat-dissipating fan on the heat sink and effectively prevents the power wire from interfering with the operation of the heat-dissipating fan or from coming into contact with the running of the blade wheel due to the power wire reaching the blade wheel of the heat-dissipating fan. Therefore, the display card can be ensured to operate normally.

Furthermore, there is no need of any glue tapes or screws, reducing the assembly cost while increasing the production yield.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following appended claims.

What is claimed is:

1. A heat sink device for a display card, comprising:
   a heat sink, having a base and a plurality of heat-dissipating fins on the base, the base having a groove and two hooks respectively beside two lateral sides of the groove;
   a heat-dissipating fan, having a blade wheel and a power wire for the blade wheel, the blade wheel being on the base and the power wire being inside the groove of the base; and
   a fastener, having two engagement parts respectively corresponding to the hooks, wherein the fastener covers the groove to position the power wire by means of engagement of the hooks with the engagement parts.

2. The heat sink device of claim 1, wherein the base has an accommodating trough for receiving the fastener.

3. The heat sink device of claim 2, wherein the groove is formed concavely on a wall of the accommodating trough.

4. The heat sink device of claim 1, wherein the base has two through holes beside two lateral sides of the groove, and each of the hooks is next to the corresponding through hole.

5. The heat sink device of claim 1, further comprising a mask, wherein the mask covers the base, and the heat-dissipating fan is between the mask and the base.

6. The heat sink device of claim 5, wherein the mask has an aperture corresponding to the blade wheel of the heat-dissipating fan.

* * * * *